US012565067B2

(12) United States Patent
Vayssettes et al.

(10) Patent No.: US 12,565,067 B2
(45) Date of Patent: Mar. 3, 2026

(54) METHOD FOR SIMULATING THE TEMPORAL EVOLUTION OF A PHYSICAL SYSTEM IN REAL TIME

(71) Applicant: COMPAGNIE GENERALE DES ETABLISSEMENTS MICHELIN, Clermont-Ferrand (FR)

(72) Inventors: Jérémy Vayssettes, Clermont-Ferrand (FR); Romain Gauchez, Clermont-Ferrand (FR); Carole Heinry, Clermont-Ferrand (FR)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 901 days.

(21) Appl. No.: 17/286,142

(22) PCT Filed: Oct. 17, 2019

(86) PCT No.: PCT/FR2019/052467

§ 371 (c)(1),
(2) Date: Apr. 16, 2021

(87) PCT Pub. No.: WO2020/079376

PCT Pub. Date: Apr. 23, 2020

(65) Prior Publication Data

US 2021/0354519 A1     Nov. 18, 2021

(30) Foreign Application Priority Data

Oct. 19, 2018     (FR) ...................................... 1859687

(51) Int. Cl.
| | |
|---|---|
| *B60C 99/00* | (2006.01) |
| *G06F 30/15* | (2020.01) |
| *G06F 30/20* | (2020.01) |

(52) U.S. Cl.
CPC ............ *B60C 99/006* (2013.01); *G06F 30/15* (2020.01); *G06F 30/20* (2020.01)

(58) Field of Classification Search
None
See application file for complete search history.

(56) References Cited

U.S. PATENT DOCUMENTS

| | | | | |
|---|---|---|---|---|
| 5,176,769 A | * | 1/1993 | Kadota | ..................... B60C 9/26 |
| | | | | 152/526 |
| 5,559,729 A | * | 9/1996 | Abe | ...................... B60C 99/006 |
| | | | | 703/2 |

(Continued)

FOREIGN PATENT DOCUMENTS

| | | | | |
|---|---|---|---|---|
| CN | 104793489 A | | 7/2015 | |
| EP | 1095794 A2 | * | 5/2001 | ............. B60C 11/00 |

(Continued)

OTHER PUBLICATIONS

Wang, Z., Ke, J., & Ma, L. (2012). Analytical method of the rolling resistance of radial tire base on ANSYS. Key Engineering Materials, 501, 259-62. (Year: 2012).*

(Continued)

*Primary Examiner* — Akash Saxena
(74) *Attorney, Agent, or Firm* — Michele V. Frank; Venable LLP

(57) ABSTRACT

A method for simulating the variation as a function of time in a physical system giving in real time the state of this system, the state of the system being defined by a set of variables that are periodically updated with a preset period (P), the method comprising updating the value of at least one of the variables (input variable), and estimating the value of at least one of the variables (estimated variable), via convergence of an iterative algorithm having as input datum the at least one input variable, in which method, if the algorithm has not converged at the end of the last iteration in a period (Continued)

called the current period, the current period having a duration shorter than or equal to the preset period (P), the iterative algorithm continues in the following period, taking up where it left off in the last iteration of the current period.

5 Claims, 3 Drawing Sheets

(56) References Cited

U.S. PATENT DOCUMENTS

| | | | | |
|---|---|---|---|---|
| 6,083,268 | A * | 7/2000 | Kelsey | B60C 99/006 |
| | | | | 73/146 |
| 6,192,745 | B1 * | 2/2001 | Tang | G06F 30/23 |
| | | | | 73/146 |
| 6,754,615 | B1 * | 6/2004 | Germann | B60C 19/00 |
| | | | | 73/146 |
| 7,103,460 | B1 * | 9/2006 | Breed | G07C 5/008 |
| | | | | 706/15 |
| 7,483,821 | B2 * | 1/2009 | Miyashita | G01M 17/02 |
| | | | | 703/8 |
| 8,290,756 | B2 * | 10/2012 | Fevrier | G06F 30/20 |
| | | | | 73/146 |
| 9,193,093 | B2 * | 11/2015 | Tsunoda | G06F 30/23 |
| 9,636,955 | B2 * | 5/2017 | Singh | B60C 23/20 |
| 9,904,745 | B2 * | 2/2018 | Kim | G06F 30/20 |
| 10,093,141 | B2 * | 10/2018 | Buisson | B60C 99/006 |
| 10,360,325 | B2 * | 7/2019 | Dorfi | G06F 30/23 |
| 10,649,458 | B2 * | 5/2020 | Sun | G05D 1/0088 |
| 11,312,188 | B2 * | 4/2022 | Tamura | G06F 30/00 |
| 11,703,423 | B2 * | 7/2023 | Cettour-Janet | G01M 17/022 |
| | | | | 73/7 |
| 2002/0134149 | A1 * | 9/2002 | Shiraishi | G01M 17/02 |
| | | | | 73/146 |
| 2004/0107081 | A1 * | 6/2004 | Miyori | B60C 99/006 |
| | | | | 703/6 |
| 2004/0130442 | A1 * | 7/2004 | Breed | G06V 20/593 |
| | | | | 340/449 |
| 2004/0243340 | A1 * | 12/2004 | Miyamoto | G06F 30/23 |
| | | | | 702/142 |
| 2005/0192727 | A1 * | 9/2005 | Shostak | G07C 5/0808 |
| | | | | 701/1 |
| 2005/0273218 | A1 * | 12/2005 | Breed | G06K 7/10178 |
| | | | | 701/2 |
| 2007/0107506 | A1 * | 5/2007 | Kishida | B60C 99/006 |
| | | | | 73/146 |
| 2007/0126561 | A1 * | 6/2007 | Breed | B60R 25/2081 |
| | | | | 340/426.13 |
| 2010/0010795 | A1 * | 1/2010 | Fevrier | G06F 30/20 |
| | | | | 703/8 |
| 2011/0303000 | A1 * | 12/2011 | Engstrom | G01M 17/0074 |
| | | | | 73/116.06 |
| 2012/0296616 | A1 * | 11/2012 | Tsunoda | G06F 30/28 |
| | | | | 703/9 |
| 2013/0238293 | A1 * | 9/2013 | Tsunoda | G06F 30/23 |
| | | | | 703/2 |
| 2013/0275104 | A1 * | 10/2013 | Imamura | G06F 30/23 |
| | | | | 703/9 |
| 2016/0167467 | A1 * | 6/2016 | Buisson | B60C 99/006 |
| | | | | 703/2 |
| 2017/0174216 | A1 * | 6/2017 | Puri | B60W 30/188 |
| 2022/0266640 | A1 * | 8/2022 | Zhou | G06F 30/15 |
| 2024/0043012 | A1 * | 2/2024 | Abe | G06F 30/15 |
| 2025/0242812 | A1 * | 7/2025 | Henderson | B60T 8/175 |

FOREIGN PATENT DOCUMENTS

| | | | | |
|---|---|---|---|---|
| EP | 1798648 | B1 * | 3/2017 | B60C 99/006 |
| FR | 2905496 | A1 * | 3/2008 | G06F 30/15 |
| WO | 2008025892 | A1 | 3/2008 | |

OTHER PUBLICATIONS

Shingo Futamura, Arthur A. Goldstein; Prediction and Simulation of Tire Performance Characteristics Based on Deformation Index Concept. Rubber Chemistry and Technology Mar. 1, 2016; 89 (1): 1-21. (Year: 2016).*

The First Office Action dated Apr. 28, 2022, directed to CN Application No. 201980068900.0; 14 pages.

International Search Report and Written Opinion issued in related International Application No. PCT/FR2019/052467, dated Jan. 3, 2020 (8 pages).

* cited by examiner

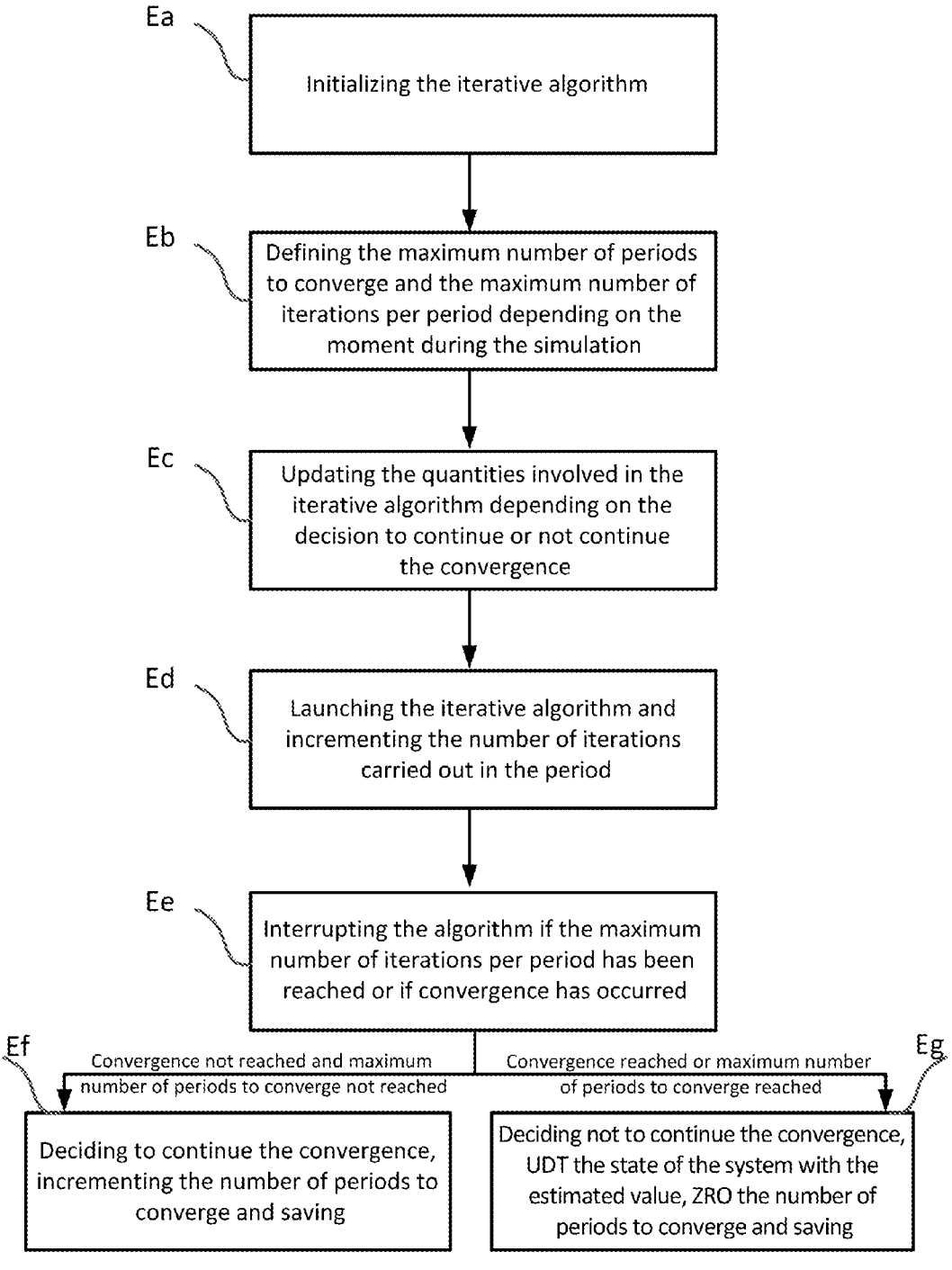

Ea — Initializing the iterative algorithm

Eb — Defining the maximum number of periods to converge and the maximum number of iterations per period depending on the moment during the simulation Ec — Updating the quantities involved in the iterative algorithm depending on the decision to continue or not continue the convergence Ed — Launching the iterative algorithm and incrementing the number of iterations carried out in the period Ee — Interrupting the algorithm if the maximum number of iterations per period has been reached or if convergence has occurred Ef — Convergence not reached and maximum number of periods to converge not reached Eg — Convergence reached or maximum number of periods to converge reached Deciding to continue the convergence, incrementing the number of periods to converge and saving Deciding not to continue the convergence, UDT the state of the system with the estimated value, ZRO the number of periods to converge and saving

Fig.4

METHOD FOR SIMULATING THE TEMPORAL EVOLUTION OF A PHYSICAL SYSTEM IN REAL TIME

CROSS-REFERENCE TO RELATED APPLICATIONS

The present application is a national stage entry under 35 U.S.C. 371 of International Patent Application No. PCT/FR2019/052467, filed Oct. 17, 2019, which claims priority to FR Application No. 1859687, filed Oct. 19, 2018, the entire disclosure of each of which is hereby incorporated by reference.

FIELD OF THE INVENTION

The invention relates to the field of the simulation of the variation in physical systems in real time. It in particular relates to a method for simulating the physical behaviour of a tyre with which a vehicle is equipped.

BACKGROUND OF THE INVENTION

The context of the invention is improvement of the software package TameTire (registered trademark of Michelin), which employs a method for simulating the physical behaviour of a tyre with which a vehicle that is being driven over the ground is equipped. The method is described in detail in patent document FR 2 905 496. The method in particular allows longitudinal forces, transverse forces and a self-alignment torque of the tyre to be computed in real time. The self-alignment torque is the torque that acts on the tyre, at the interface with the ground, about a Z-axis that passes through the centre of the contact patch, that is orthogonal to the surface of the ground and that points upward.

The computation of these forces involves solving systems of partial differential equations. Solving these systems of equations requires non-linear computational methods based on the convergence of an iterative algorithm to be employed. In other words, the computation of these forces in each sampling period requires a plurality of computational iterations.

In certain applications, for example in the context of driving simulators, the computation must be carried out in real time. This means that, in each sampling period of the simulation, the computation of the quantities must be completed in order to meet the constraints of real time and to ensure correct operation of the simulation. For high sampling frequencies, the sampling period of the simulation is short, for example about 0.001 ms for driving simulators. Thus, a single period is often not enough to allow thermo-mechanical functional models such as TameTire to converge to sufficiently accurate force values.

In such cases, the inadequacy of the permitted computation times causes the simulation to operate poorly in real time. Under these conditions, three solutions are conventionally used to circumvent the problem.

The first solution consists in simplifying the model and therefore the equations used, in order to accelerate the computations carried out in each iteration. Such simplifications therefore lead to a decrease in computation time. However, this first solution leads to a decrease in the accuracy of the computations.

The second solution consists in limiting the permitted number of iterations in each sampling period, in order to ensure the constraints of real time are met. However, this second solution also results in a substantial decrease in the accuracy of the computations. Specifically, the force values used for the simulation do not necessarily result from a computation that has converged and are therefore not necessarily representative of reality.

The third solution consists in parallelizing the internal computations of the model or in parallelizing the calls to the model if the latter must be called a plurality of times as is the case for the tyre model, which is called four times for a four-wheeled vehicle. This solution uses the computing power of present-day computers to meet the constraints of real time without decreasing the accuracy of the model. However, parallelizing computations requires additional computational tasks to be created and managed. This management is dependent on the computational technologies used in the host environments of the simulation. It is therefore possible to guarantee that parallelized computations will work well only by placing constraints on the computational management of the host environment of the simulation. This third solution is therefore not applicable to a model such as TameTire that is designed to be an off-the-shelf software package that may be used in various simulation environments managed by a third party.

The invention provides a solution that aims to mitigate the aforementioned drawbacks. One objective of the invention is to provide a simulating method that allows the constraints of real time to be met while obtaining simulation results of good accuracy, whatever the simulation environment used.

BRIEF SUMMARY OF THE INVENTION

The invention relates to a method for simulating the variation as a function of time in a physical system giving in real time the state of this system, the state of the system being defined by a set of variables associated with physical data of said system, which are periodically updated with a preset period, the method comprising:

updating the value of at least one of the variables, which is called the input variable, and estimating the value of at least one of the variables, which is called the estimated variable, via convergence of an iterative algorithm having as input datum the at least one input variable.

in which method if the algorithm has not converged at the end of the last iteration in a period called the current period, the current period having a duration shorter than or equal to the preset period, the iterative algorithm continues in the following period, taking up where it left off in the last iteration of the current period. This allows the constraints of real time to be met insofar as the durations of the periods do not exceed the durations of the corresponding real time. Furthermore, accuracy is guaranteed insofar as the method makes it possible to obtain for the estimated variable a value output by a computation that has converged.

According to one particular embodiment of the invention, if the algorithm has not converged at the end of the last iteration in the current period, the value of the estimated variable taken into account in the update of the state of the system is the value of the variable estimated in the period preceding the current period. Insofar as the variations in the estimated variable are not very large from one period to the next, this allows a good approximation of the estimated variable to be obtained while waiting for the algorithm to converge.

According to one particular embodiment of the invention, a maximum number of periods to converge is defined and the iterative algorithm continues in the following period if the maximum number of periods to converge has not been reached. This makes it possible to guarantee that the estimated variable will be refreshed at a rate that will ensure a good simulation accuracy.

According to one particular embodiment of the invention, a maximum number of iterations per period is defined and the iterative algorithm performs a number of iterations in each period lower than or equal to the maximum number of iterations per period. This makes it possible to guarantee that the maximum number of iterations that may be computed in a period of time is never exceeded.

According to one particular embodiment of the invention, the maximum number of periods to converge is configurable. This makes it possible to adapt to various simulation environments.

According to one particular embodiment of the invention, the maximum number of iterations per period is configurable. This makes it possible to adapt to various simulation environments.

According to one particular embodiment of the invention, the method comprises parameterizing the number of iterations required to converge. This for example allows the maximum number of iterations per period and the maximum number of periods to converge to be adjusted in order to uniformly distribute the convergence over a plurality of time increments.

According to one particular embodiment of the invention, whether the algorithm has converged is determined via a convergence criterion and in that the convergence criterion is adapted depending on the number of iterations required to converge.

According to one particular embodiment of the invention, whether the algorithm has converged is determined by a convergence criterion and in that the convergence criterion determines that convergence has occurred if the difference between two values computed for the estimated variable in the last two iterations of the algorithm is smaller than a threshold.

According to one particular embodiment of the invention, the method comprises saving the quantities involved in the iterative algorithm.

According to one particular embodiment of the invention, the maximum number of periods to converge is defined so that the frequency of update of the estimated variable is higher than two times the maximum frequency of variation in the quantity represented by the estimated variable. This allows the Nyquist criterion to be met, in order to estimate the variable with a good accuracy.

According to one particular embodiment, the method simulates the behaviour of a tyre.

The invention also relates to a method for simulating the physical behaviour of a tyre with which a vehicle is equipped, the tread of the tyre having with the ground a contact patch including a region of gripping contact and a region of sliding contact, the region of gripping contact being separated from the region of sliding contact by a border of an abscissa that is assumed unique, the method giving in real time the state of a system modelling the physical behaviour of the tyre, the state of the system being defined by a set of variables that are periodically updated with a preset period, the method comprising:

updating the value of at least one of the variables, which is called the input variable, depending on the physical conditions under which the tyre is being run and used, and estimating the value of at least one of the variables, which is called the estimated variable, via convergence of an iterative algorithm having as input datum the at least one input variable, the estimated variable being:

the magnitude of the longitudinal forces transmitted by the tyre between the ground and the vehicle, the magnitude of the transverse forces transmitted by the tyre between the ground and the vehicle, the moment of the self-alignment torque acting on the tyre at the centre of the interface with the ground about a vertical axis, or the abscissa of the border between the regions of sliding and gripping contact, in which method, if the algorithm has not converged at the end of the last iteration in a period called the current period, the iterative algorithm continues in the following period, taking up where it left off in the last iteration of the current period.

BRIEF DESCRIPTION OF THE FIGURES

Other innovative features and advantages will become apparent from the completely non-limiting description below, which is provided, by way of indication, with reference to the appended drawings, in which:

FIG. 4 is a flowchart of a method according to one embodiment of the invention.

DETAILED DESCRIPTION OF THE INVENTION

The context of the described method is a simulation of the variation as a function of time in a physical system giving in real time the state of this system. The state of the system is defined by a set of variables associated with physical data of the system. The variables are periodically updated with a preset period.

In the context of the method, the computation of at least one of the variables of the system, which is called the estimated variable, requires equations to be solved by means of non-linear computational methods based on the convergence of an iterative algorithm. The iterative algorithm allows the equations to solved via successive approximations of the estimated variable. The equations define the relationships between the estimated variable and at least one of the other variables of the state of the system, which is called the input variable.

The method therefore comprises:

updating the input variable and estimating the value of the estimated variable, via convergence of an iterative algorithm having as input datum the at least one input variable.

The input variable is for example obtained by computation or via an acquisition. The acquisition is for example received from a sensor measuring the value of the input variable.

Figure 1A:
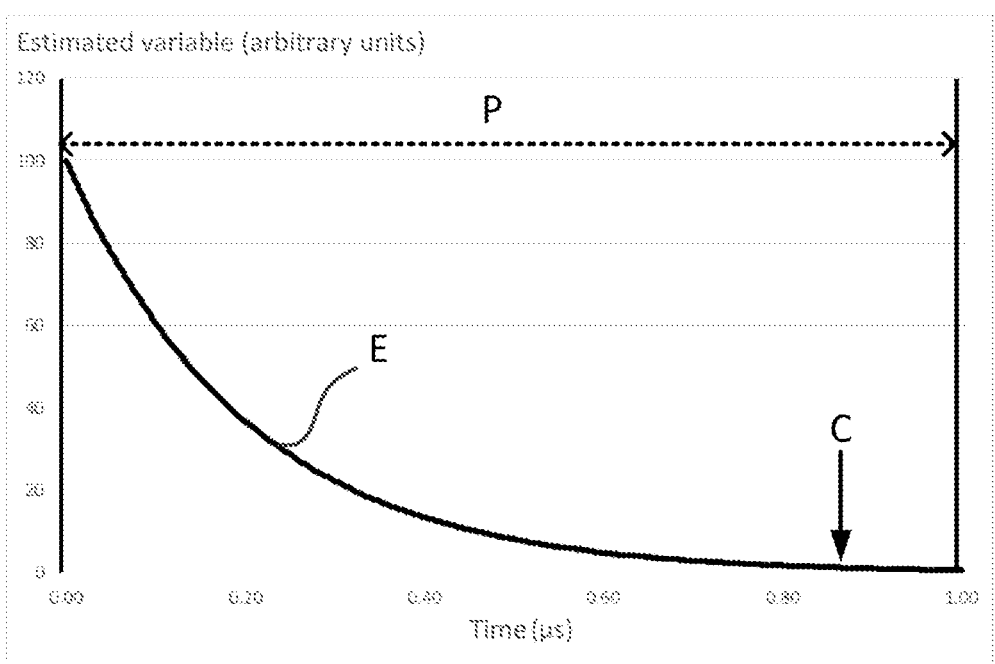
FIG. 1a is a graph showing the convergence of an estimated variable over a single sampling period.

FIG. 1a is a graph showing a conventional case of convergence of an estimated variable E over a single sampling period P.

Whether the algorithm has converged is determined by a convergence criterion. In the example, the convergence criterion determines that convergence has occurred if the difference between two values computed for the estimated variable in the last two iterations of the algorithm is smaller than a threshold. In the graph in FIG. 1a, convergence occurs at point C.

Figure 1B:
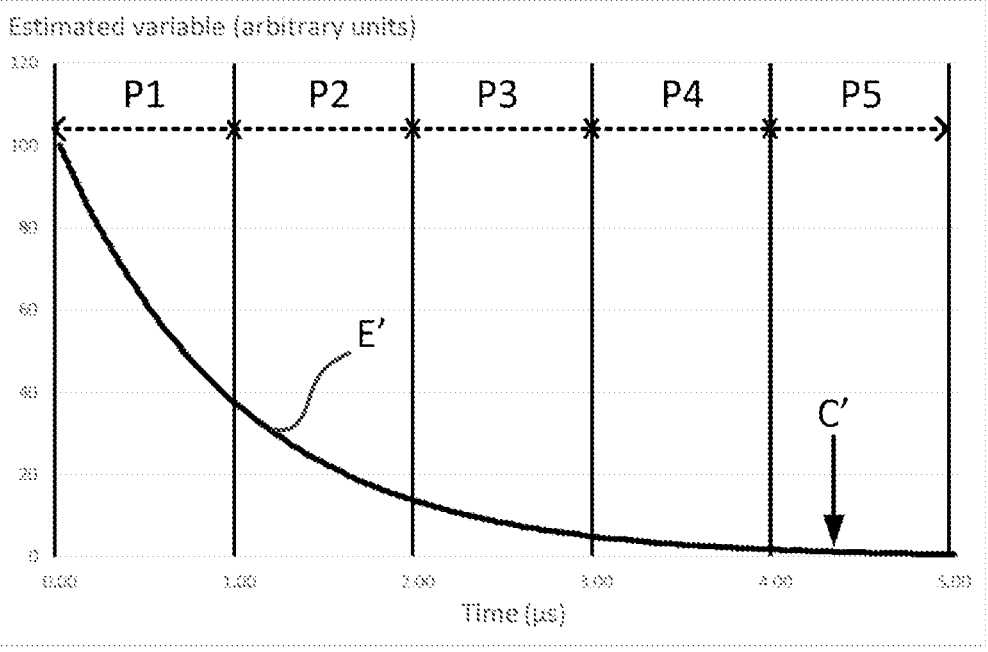
FIG. 1b is a graph showing the convergence of an estimated variable over a plurality of sampling periods according to one embodiment of the invention.

In certain cases, convergence does not occur before the end of the last iteration in a period called the current period, the current period having a duration shorter than or equal to the preset period. This is for example the case in FIG. 1b which shows the convergence of an estimated variable E' over a plurality of sampling periods P1 to P5 according to one embodiment of the invention. Specifically, at the end of the period P1, the convergence criterion has not been met.

The described method thus proposes that the iterative algorithm continue in the following period P2, taking up where it left off in the last iteration of the current period P1. At the end of the last iteration in period P2, convergence has not been reached; thus, the iterative algorithm continues in period P3, taking up where it left off in the last iteration of period P2. Likewise, convergence is still not reached in periods P3 and P4. Therefore, the iterative algorithm continues in period P4, taking up where it left off in the last iteration of the period P3; then continues in period P5, taking up where it left off in the last iteration of the period P4. It is only in period P5 that convergence is reached at point C'.

According to one more specific example, the method is a method for simulating the physical behaviour of a tyre with which a vehicle is equipped. The method is for example implemented in a driving simulator. Thus, the method gives in real time the state of a system modelling the physical behaviour of the tyre, the state of the system being defined by a set of variables that are periodically updated with a period.

The tread of the tyre has with the ground a contact patch including a region of gripping contact and a region of sliding contact. The region of gripping contact is separated from the region of sliding contact by a border of an abscissa b that is assumed unique.

The method comprises:
updating the value of at least one of the variables, which is called the input variable, depending on the physical conditions under which the tyre is being run and used, and
estimating the value of at least one of the variables, which is called the estimated variable, via convergence of an iterative algorithm having as input datum the at least one input variable.

The estimated variable is for example:
the magnitude of the longitudinal forces (Fx) transmitted by the tyre between the ground and the vehicle,
the magnitude of the transverse forces (Fy) transmitted by the tyre between the ground and the vehicle,
the moment of the self-alignment torque (Mx) acting on the tyre at the centre of the interface with the ground about a vertical axis, or
the abscissa (b) of the border between the regions of sliding and gripping contact.

The equations defining the relationships between the various variables of the state of the system are described in detail in patent document FR 2 905 496.

In the described method, if the algorithm has not converged at the end of the last iteration in a period called the current period, the iterative algorithm continues in the following period, taking up where it left off in the last iteration of the current period.

Figures 2, 3A, 3B:
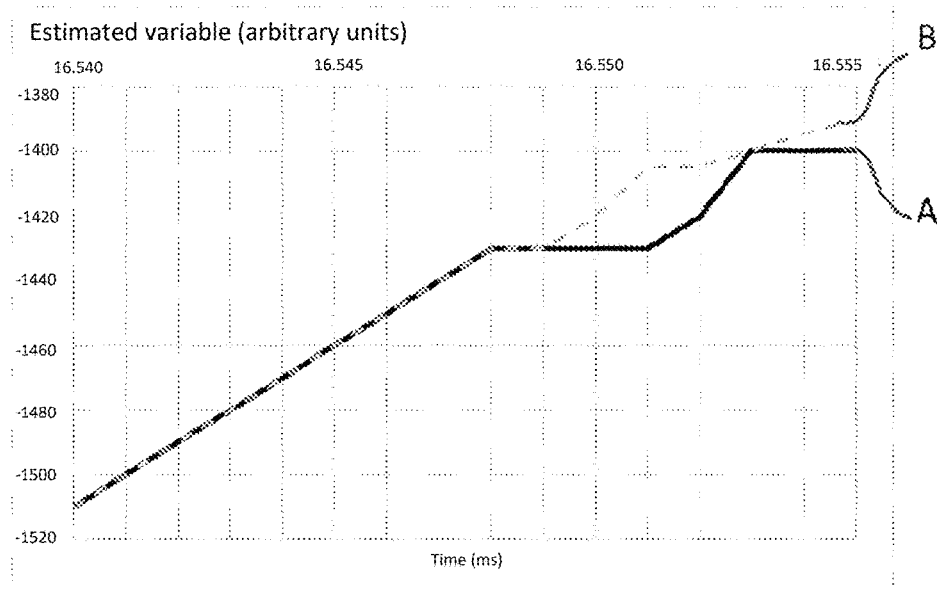
FIG. 2 is a graph showing, superposed, the variation as a function of time in a variable estimated with a constraint of real time according to one embodiment of the invention and the variation as a function of time in the same variable estimated without any constraints with respect to real time.
FIGS. 3a and 3b show the results and the computing time of both simulations without and with ability to converge over a plurality of time increments, respectively.

FIG. 2 is a graph showing superposed:
curve A: the variation as a function of time in a variable estimated with a constraint of real time according to one embodiment of the invention; and
curve B: the variation as a function of time in the same variable estimated without any constraints with respect to real time.

For curve A, respect of real time is guaranteed by a period sampling of 0.001 ms. The ability to converge the estimated variable over a plurality of sampling periods is implemented according to one embodiment of the invention.

For curve B, respect of real time is not guaranteed. Thus, the computation time required to obtain curve B, which simulates the variation in the estimated variable over the period of time extending from 16.540 ms to 16.555 ms, is longer than the duration of this period of time. Specifically, to obtain the value of the estimated variable in each time increment of the time period, the program of curve B takes the computing time required to obtain convergence of the estimated variable. This required computing time may be longer than the time increment, as will be seen.

Up to the time increment 16.549 ms curves A and B superpose exactly, this meaning that the iterative algorithm allowing the estimated variable to be obtained converges in less than 0.001 ms, i.e. that the convergence of the estimated variable is obtained in a single sampling period.

In contrast, in the time increment 16.550 ms, curves A and B separate. Specifically, the iterative algorithm needs three time increments to converge. Consequently, the program of curve A returns, in the time increments 16.550 ms and 16.551 ms, the last estimated-variable value, namely −1430, obtained in the time increment 16.549 ms. In the time increment 16.552 ms, the program of curve A has obtained the convergence of the estimated variable and returns a value of the estimated variable corresponding to the time increment 16.550 ms. The value of the estimated variable in the time increment 16.552 ms on curve A is therefore equal to the value of the estimated variable in the time increment 16.550 ms on curve B, namely −1420.

In the time increment 16.553 ms, the iterative algorithm allowing the estimated variable to be obtained has converged in less than one sampling period. The value of the estimated variable in the time increment 16.552 ms on curve A is therefore equal to the value of the estimated variable on curve B, namely −1400.

In this example, if the algorithm has not converged at the end of the last iteration in the current period, the value of the estimated variable taken into account in the update of the state of the system is the value estimated in the period preceding the current period. In other words, the estimated variable remains constant the time taken to obtain convergence.

According to a particular embodiment of the invention (not shown), if convergence does not occur, the iterative algorithm continues in the following period.

FIGS. 3a and 3b show the results and the computing time of two simulations without and with ability to converge over a plurality of time increments, respectively. The two simulations represent the same physical system. They are run on a machine without any constraints with respect to real time, i.e. the computing time may be slower or faster than real time. For each time increment of the simulation, values are computed for the various variables.

In the case of FIG. 3*a*, the ability to converge over a plurality of time increments is implemented according to one embodiment of the invention. In contrast, in the case of FIG. 3*b*, the variables of a time increment are computed only once all the variables of the preceding time increment have been obtained, i.e. once all the algorithms of the preceding time increment have converged.

Comparison of FIGS. 3*a* and 3*b* shows that the total computing time of the simulation (Elapsed Clock Time) Ta and Tb, respectively, is shorter in FIG. 3*a* than in FIG. 3*b* and consequently that the computational efficiency (Computational Efficiency) Sa and Sb, respectively, which corresponds to the duration of the simulated time period divided by the computing time, is better in FIG. 3*a* than in FIG. 3*b*. Comparison of FIGS. 3*a* and 3*b* also shows that the results of the two simulations Ra and Rb, respectively, are identical (LAP TIME . . . STEERING MIN). This demonstrates that the implementation of the ability to converge over a plurality of time increments increases the efficiency of the computations while maintaining the accuracy of the results.

FIG. 4 is a flowchart of a method according to one embodiment of the invention.

The method comprises the following steps:

Ea: initializing the iterative algorithm;

Eb: defining the maximum number of periods to converge and the maximum number of iterations per period depending on the moment during the simulation;

Ec: updating the quantities involved in the iterative algorithm depending on the decision to continue or not continue the convergence;

Ed: launching the iterative algorithm and incrementing the number of iterations carried out in the period;

Ee: interrupting the algorithm if the maximum number of iterations per period has been reached or if convergence has occurred;

Ef: deciding to continue the convergence, incrementing the number of periods to converge and saving;

Eg: deciding not to continue the convergence, updating (UDT) the state of the system with the value estimated for the estimated variable, zeroing (ZRO) the number of periods to converge and saving.

Step Ea of initializing the iterative algorithm allows elements of the algorithm to be initialized, before the iterations of the algorithm in a period are launched. For example, in this step, the following elements are initialized:

the mathematical relationship involved in the algorithm, with parameters that are for example delivered by the rest of the model or by the simulation environment, an initial value of the iterative-algorithm estimated variable, which is for example provided by the rest of the model or by the simulation environment, the decision to continue or not continue the convergence, as represented by the quantities involved in the algorithm saved in the previous period, the maximum number of periods to converge and the maximum number of iterations per period, which are for example set by a user.

Step Eb of defining the maximum number of periods to converge and the maximum number of iterations per period depending on the moment during the simulation distinguishes between the following two cases:

if the simulation has just started, then convergence over a time increment with a high permitted number of iterations is required,

else, it is the values of the maximum number of periods to converge and of the maximum number of iterations per period set during initialization of the algorithm that are taken into account.

Step Ec of updating the quantities involved in the iterative algorithm depending on the decision to continue or not continue the convergence distinguishes between the following two cases:

if the decision to continue convergence was made, the saved quantities involved are loaded into the iterative algorithm, these quantities being:

the last value of the estimated variable, the number of time periods that have already been used, the state of the iterative algorithm, in order to allow the convergence to be taken up where it was left off;

if the decision not to continue convergence was made, the initial iterative-algorithm estimated-variable value set in step Ea of initializing the iterative algorithm is loaded.

Step Ed of launching the iterative algorithm and of incrementing the number of iterations performed in the period corresponds to an iterative loop in which, in each iteration, the value of the estimated variable is updated according to X=X+alpha where X is the value of the variable estimated in the previous iteration and alpha is a convergence direction computed by the algorithm, in particular by virtue of the mathematical relationship obtained in step Ea of initializing the iterative algorithm.

Step Ee of interrupting the algorithm if the maximum number of iterations per period has been reached or if convergence has occurred allows the iterative loop to be interrupted if, at the end of an iteration:

the maximum number of iterations per period has been reached, or convergence has occurred, i.e. if the convergence criterion has been met.

At the end of step Ee of interrupting the algorithm, the following two cases are distinguished:

if convergence has not occurred and the maximum number of periods to converge has not been reached, for example when the algorithm has been interrupted because the maximum number of iterations per period has been reached, step Ef of deciding to continue the convergence, of incrementing the number of periods to converge and of saving is passed to;

if convergence has occurred or the maximum number of periods to converge has been reached, step Eg of deciding not to continue the convergence, of updating the state of the system with the value estimated for the estimate variable, of zeroing the number of periods to converge and of saving is passed to;

In the step Ef of deciding to continue the convergence, of incrementing the number of periods to converge and of saving, the following operations are carried out:

updating a dedicated parameter with the decision to continue convergence, incrementing the number of periods to converge, saving the quantities required for the following time period.

In the step Eg of deciding not to continue the convergence, of updating the state of the system with the value estimated for the estimated variable, of zeroing the number of periods to converge and of saving, the following operations are carried out:

updating a dedicated parameter with the decision not to continue convergence, updating the state of the system with the value of the estimated variable estimated in the last iteration of the algorithm, zeroing the number of periods to converge, and saving the quantities required for the following time period.

In the example of the method of FIG. 4, a maximum number of periods to converge is defined and the iterative algorithm continues to the following period if the maximum number of periods to converge has not been reached. The maximum number of periods to converge is configurable and is set manually by the user.

Likewise, a maximum number of iterations per period is defined and the iterative algorithm performs a number of iterations in each period lower than or equal to the maximum number of iterations per period. The maximum number of iterations per period is also configurable and is set manually by the user.

In a particular embodiment, the parameterization of the maximum number of periods to converge comprises an upper limit so that the maximum number of periods to converge must be defined so that the frequency of update of the estimated variable is higher than two times the maximum frequency of variation in the quantity represented by the estimated variable. This makes it possible to meet the Nyquist criterion and to guarantee that the variations in the estimated variable are representative of the variations in the represented quantity.

The invention was described above by way of example. It will be understood that a person skilled in the art will be able to produce various variant embodiments of the invention, for example by associating various of the above features alone or in combination, without however departing from the scope of the claimed invention.

The invention claimed is:

1. A method for simulating physical behavior of a tire with which a vehicle is equipped, tread of the tire having contact with the ground, the method comprising:

executing, via at least one processor of a computer system, a driving simulator;

while the driving simulator is executing:

defining, via the processor, a maximum number of iterations per period of time based on a moment during simulation;

executing a plurality of iterations over a plurality of periods of time;

while the driving simulator is executing, after defining the maximum number of iterations per period of time:

repeatedly determining, via the at least one processor, if the maximum number of iterations per period of time have been executed, wherein when a maximum number of predefined periods of time have been executed the driving simulator terminates; and executing via the at least one processor, an iterative algorithm as part of the driving simulator to determine if a convergence criterion has been met, the iterative algorithm comprising:

repeating, until either (A) a convergence criterion has been met or (B) the maximum number of predefined periods of time have been executed:

capturing, via a sensor at a sampling rate of 0.001 ms, an input variable, the input variable identifying physical conditions of a vehicle tire in contact with ground;

estimating, via the at least one processor of the computer system based at least in part on the input variable, a current value of at least one estimated variable, the estimated variable being:

a magnitude of longitudinal forces (Fx) transmitted by the vehicle tire between the ground and a vehicle comprising the vehicle tire, a magnitude of transverse forces (Fy) transmitted by the vehicle tire between the ground and the vehicle, a moment of self-alignment torque (Mx) acting on the vehicle tire at a center of contact with the ground about a vertical axis, or an abscissa (b) of border between regions of sliding and gripping contact; and comparing, via the at least one processor, the current value of the at least one estimated variable to a stored value of the at least one estimated variable, the stored value of the at least one estimated variable having been calculated on an immediately preceding iteration, resulting in a comparison, wherein:

the plurality of iterations are performed per period of time;

the convergence criterion is met when the comparison is smaller than a predetermined threshold, wherein determining if the convergence criterion is met occurs in less than 0.001 ms; and upon meeting the convergence criterion the driving simulator terminates; and outputting the at least one estimated variable to identify physical behavior of the vehicle tire, such that the computer system identifies and outputs the at least one estimated variable using less computational power than if the plurality of iterations occurred under a single period of time.

2. The method of claim 1, characterized in that, if the convergence criterion has not been met by an expiration of a specific predefined period of time, the current value of the at least one estimated variable is assigned as equal to a previously calculated value, the previously calculated value calculated during a preceding predefined period of time, the preceding predefined period of time immediately preceding the specific predefined period of time.

3. The method of claim 1, characterized in that the maximum number of periods to converge is configurable.

4. The method of claim 1, characterized in that the maximum number of iterations per period is configurable.

5. The method of claim 1, characterized in that it simulates behavior of the vehicle tire.

* * * * *